United States Patent
Sun

(10) Patent No.: US 9,646,526 B2
(45) Date of Patent: May 9, 2017

(54) GATE DRIVING UNIT, GATE DRIVING CIRCUIT AND DRIVING METHOD THEREOF, AND DISPLAY DEVICE

(71) Applicants: Shanghai Tianma Micro-Electronics Co., Ltd., Shanghai (CN); Tianma Micro-Electronics Co., Ltd., Shenzhen (CN)

(72) Inventor: Yungang Sun, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 96 days.

(21) Appl. No.: 14/684,236

(22) Filed: Apr. 10, 2015

(65) Prior Publication Data

US 2016/0155422 A1    Jun. 2, 2016

(30) Foreign Application Priority Data

Nov. 27, 2014    (CN) .......................... 2014 1 0705133

(51) Int. Cl.
| | | |
|---|---|---|
| *G11C 19/00* | (2006.01) | |
| *G09G 3/20* | (2006.01) | |
| *G11C 19/28* | (2006.01) | |
| *G09G 3/3266* | (2016.01) | |
| *G09G 3/36* | (2006.01) | |

(52) U.S. Cl.
CPC ............. *G09G 3/20* (2013.01); *G11C 19/287* (2013.01); *G09G 3/3266* (2013.01); *G09G 3/3677* (2013.01); *G09G 2310/0267* (2013.01); *G09G 2310/0283* (2013.01); *G09G 2310/0286* (2013.01); *G09G 2310/0289* (2013.01); *G09G 2310/08* (2013.01); *G11C 19/28* (2013.01)

(58) Field of Classification Search
None
See application file for complete search history.

(56) References Cited

U.S. PATENT DOCUMENTS

| | | | |
|---|---|---|---|
| 8,565,369 B2 | 10/2013 | Takahashi et al. | |
| 9,396,682 B2* | 7/2016 | Xia ...................... | G09G 3/3266 |
| 2008/0219401 A1* | 9/2008 | Tobita .................. | G09G 3/3677 377/79 |
| 2008/0297495 A1* | 12/2008 | Jung ........................ | G09G 3/20 345/204 |

(Continued)

*Primary Examiner* — Tuan T Lam
(74) *Attorney, Agent, or Firm* — Anova Law Group, PLLC

(57) ABSTRACT

A gate driving unit, a gate driving circuit, a driving method thereof, and a display device are disclosed. The gate driving unit includes first to eighth transistors, a first capacitor and a second capacitor. The gate driving circuit includes multiple gate driving units arranged along a first direction, of which first timing control signal terminals and second timing control signal terminals of respective stages are electrically connected to a first lead terminal and a second lead terminal respectively. In addition, the gate driving circuit is driven along the first direction or along a second direction in reset periods and shift periods. The display device includes a display region and a frame region surrounding the display region, where a portion of the frame region on at least one side of the display region is provided with a gate driving circuit.

20 Claims, 12 Drawing Sheets

(56) References Cited

U.S. PATENT DOCUMENTS

| | | | | |
|---|---|---|---|---|
| 2010/0156869 | A1* | 6/2010 | Lee | G09G 3/3677 345/208 |
| 2011/0193831 | A1* | 8/2011 | Kunimori | G11C 19/184 345/204 |
| 2012/0068994 | A1* | 3/2012 | Li | G09G 3/3677 345/213 |
| 2012/0182050 | A1* | 7/2012 | Yang | G09G 3/3266 327/109 |
| 2013/0077736 | A1* | 3/2013 | Son | G09G 3/20 377/69 |
| 2014/0071104 | A1* | 3/2014 | Gao | G11C 19/28 345/208 |
| 2014/0292628 | A1* | 10/2014 | Park | G09G 3/3677 345/100 |
| 2015/0015562 | A1* | 1/2015 | Han | G09G 3/3266 345/212 |
| 2015/0016584 | A1* | 1/2015 | Dun | G11C 27/04 377/68 |
| 2015/0187320 | A1* | 7/2015 | Ren | G09G 3/3696 345/87 |
| 2015/0187323 | A1* | 7/2015 | Jin | G09G 5/003 345/215 |
| 2015/0280704 | A1* | 10/2015 | Wu | G09G 3/3677 345/100 |
| 2016/0093264 | A1* | 3/2016 | Gu | G11C 19/28 345/212 |
| 2016/0103510 | A1* | 4/2016 | Liu | H03K 17/687 345/214 |
| 2016/0189649 | A1* | 6/2016 | Xiao | G09G 3/3677 345/214 |
| 2016/0225336 | A1* | 8/2016 | Gu | G11C 19/28 |

* cited by examiner

GATE DRIVING UNIT, GATE DRIVING CIRCUIT AND DRIVING METHOD THEREOF, AND DISPLAY DEVICE

CROSS-REFERENCES TO RELATED APPLICATIONS

This application claims the benefit of priority to Chinese Patent Application No. 201410705133.9, filed with the Chinese Patent Office on Nov. 27, 2014 and entitled "GATE DRIVING UNIT, GATE DRIVING CIRCUIT AND DRIVING METHOD THEREOF, AND DISPLAY DEVICE", the content of which is incorporated herein by reference in its entirety.

TECHNICAL FIELD

The disclosure relates to a drive device, particularly to a gate driving unit, a gate driving circuit and driving method thereof, and a display device including the gate driving circuit.

BACKGROUND OF THE INVENTION

In recent years, active-matrix display devices are widely used. A conventional display device includes multiple scan lines (gate lines), multiple signal lines (data lines), a scan (gate) driving circuit and a signal (data) driving circuit. The driving circuits are disposed at a frame region of the display device, and include multiple transistors. As shown in FIG. 1, the driving circuit includes first to ninth transistors, a first capacitor and a second capacitor. Gates of the fourth transistor and the fifth transistor are electrically connected to a reset terminal, and in a reset period, the fourth transistor is used to reset the circuit, and the fifth transistor is used to stabilize output of the circuit. Stability of the circuit is ensured in the reset period since two transistors are used in the reset. However, space occupied by the two transistors and associated wirings should not be underestimated, thus number of the transistors greatly restricts size decrease of the driving circuit and restricts size decrease of the frame in a display screen.

BRIEF SUMMARY OF THE INVENTION

One inventive aspect discloses a gate driving unit. The gate driving unit includes first, second, third, fourth, fifth, sixth, seventh, and eighth transistors, and first and second capacitors. A gate of the first transistor is electrically connected to a first input terminal of the gate driving unit, a first electrode of the first transistor is electrically connected to a first scanning control signal terminal of the gate driving unit, and a second electrode of the first transistor is electrically connected to a second electrode of the second transistor. A gate of the second transistor is electrically connected to a second input terminal of the gate driving unit, a first electrode of the second transistor is electrically connected to a second scanning control signal terminal of the gate driving unit, and a gate of the third transistor is electrically connected to a second electrode of the first capacitor. A first electrode of the third transistor is electrically connected to a first potential, a second electrode of the third transistor is electrically connected to the second electrodes of the first and second transistors, and a gate of the fourth transistor is electrically connected to a reset signal terminal of the gate driving unit. A first electrode of the fourth transistor is electrically connected to the first potential, a second electrode of the fourth transistor is electrically connected to the second electrodes of the first and second transistors, and a gate of the fifth transistor is electrically connected to the second electrodes of the first and second transistor. A first electrode of the fifth transistor is electrically connected to the first potential, a second electrode of the fifth transistor is electrically connected to the second electrode of the first capacitor, and a gate of the sixth transistor is electrically connected to the second electrode of the first capacitor. A first electrode of the sixth transistor is electrically connected to the first potential, the second electrode of the sixth transistor is electrically connected to an output terminal of the gate driving unit, and a gate of the seventh transistor is electrically connected to a second timing control signal terminal of the gate driving unit. A first electrode of the seventh transistor is electrically connected to the first potential, a second electrode of the seventh transistor is electrically connected to the output terminal of the gate driving unit, and a gate of the eighth transistor is electrically connected to the second electrodes of the first and second transistors a first electrode of the eighth transistor is electrically connected to a first timing control signal terminal of the gate driving unit. A second electrode of the eighth transistor is electrically connected to the output terminal of the gate driving unit, a first electrode of the first capacitor is electrically connected to the first electrode of the eighth transistor, and the second electrode of the first capacitor is electrically connected to the gate of the third transistor. A first electrode of the second capacitor is electrically connected to the second electrodes of the first and second transistors, and a second electrode of the second capacitor is electrically connected to the output terminal of the gate driving unit.

Another inventive aspect discloses a gate driving circuit including a plurality of gate driving circuits arranged along a first direction, where each of the gate driving units includes a first transistor, a second transistor, a third transistor, a fourth transistor, a fifth transistor, a sixth transistor, a seventh transistor, an eighth transistor, a first capacitor and a second capacitor. A gate of the first transistor is electrically connected to a first input terminal of the gate driving unit, a first electrode of the first transistor is electrically connected to a first scanning control signal terminal of the gate driving unit, and a second electrode of the first transistor is electrically connected to a second electrode of the second transistor. A gate of the second transistor is electrically connected to a second input terminal of the gate driving unit, a first electrode of the second transistor is electrically connected to a second scanning control signal terminal of the gate driving unit, and a gate of the third transistor is electrically connected to a second electrode of the first capacitor. A first electrode of the third transistor is electrically connected to a first potential, a second electrode of the third transistor is electrically connected to the second electrodes of the first transistor and the second transistor, and a gate of the fourth transistor is electrically connected to a reset signal terminal of the gate driving unit. A first electrode of the fourth transistor is electrically connected to the first potential, a second electrode of the fourth transistor is electrically connected to the second electrodes of the first transistor and the second transistor, a gate of the fifth transistor is electrically connected to the second electrodes of the first transistor and the second transistor, and a first electrode of the fifth transistor is electrically connected to the first potential. A second electrode of the fifth transistor is electrically connected to the second electrode of the first capacitor, a gate of the sixth transistor is electrically connected to the second electrode of the first capacitor, a first electrode of the sixth transistor is electrically connected to the first potential, the second electrode of the sixth transistor is electrically connected to an output terminal of the gate driving unit, and a gate of the seventh transistor is electrically connected to a second timing control signal terminal of the gate driving unit. A first electrode of the seventh transistor is electrically connected to the first potential, a second electrode of the seventh transistor is electrically connected to the output terminal of the gate driving unit, a gate of the eighth transistor is electrically connected to the second electrodes of the first transistor and the second transistor, and a first electrode of the eighth transistor is electrically connected to a first timing control signal terminal. A second electrode of the eighth transistor is electrically connected to the output terminal of the gate driving unit, a first electrode of the first capacitor is electrically connected to the first electrode of the eighth transistor, the second electrode of the first capacitor is electrically connected to the gate of the third transistor, and a first electrode of the second capacitor is electrically connected to the second electrodes of the first transistor and the second transistor. A second electrode of the second capacitor is electrically connected to the output terminal of the gate driving unit, an output terminal of a preceding stage gate driving unit is electrically connected to a first input terminal of a following stage gate driving unit, and a second input terminal of the preceding stage gate driving unit is electrically connected to an output terminal of the following stage gate driving unit. The first timing control signal terminals of gate driving units in odd-numbered stages are electrically connected to each other, the second timing control signal terminals of gate driving units in even-numbered stages are electrically connected to each other, the first timing control signal terminals of the gate driving units in odd-numbered stages and the second timing control signal terminals of the gate driving units even-numbered stages are electrically connected to a first lead terminal, and the second timing control signal terminals of the gate driving units in odd-numbered stages are electrically connected to each other. The first timing control signal terminals of the gate driving units in even-numbered stages are electrically connected to each other, and the second timing control signal terminals of the gate driving units in odd-numbered stages and the first timing control signal terminals of the gate driving units in even-numbered stages are electrically connected to a second lead terminal.

Another inventive aspect discloses a display device including a display region and a frame region surrounding the display region. A, portion of the frame region on at least one side of the display region is provided with a gate driving circuit. The gate driving circuit includes a plurality of gate driving circuits arranged along a first direction, where each of the gate driving units includes a first transistor, a second transistor, a third transistor, a fourth transistor, a fifth transistor, a sixth transistor, a seventh transistor, an eighth transistor, a first capacitor and a second capacitor. A gate of the first transistor is electrically connected to a first input terminal of the gate driving unit, a first electrode of the first transistor is electrically connected to a first scanning control signal terminal of the gate driving unit, a second electrode of the first transistor is electrically connected to a second electrode of the second transistor, and a gate of the second transistor is electrically connected to a second input terminal of the gate driving unit. A first electrode of the second transistor is electrically connected to a second scanning control signal terminal of the gate driving unit, a gate of the third transistor is electrically connected to a second electrode of the first capacitor, a first electrode of the third transistor is electrically connected to a first potential, and a second electrode of the third transistor is electrically connected to the second electrodes of the first transistor and the second transistor. A gate of the fourth transistor is electrically connected to a reset signal terminal of the gate driving unit, a first electrode of the fourth transistor is electrically connected to the first potential, a second electrode of the fourth transistor is electrically connected to the second electrodes of the first transistor and the second transistor, a gate of the fifth transistor is electrically connected to the second electrodes of the first transistor and the second transistor, and a first electrode of the fifth transistor is electrically connected to the first potential. A second electrode of the fifth transistor is electrically connected to the second electrode of the first capacitor, a gate of the sixth transistor is electrically connected to the second electrode of the first capacitor, a first electrode of the sixth transistor is electrically connected to the first potential, the second electrode of the sixth transistor is electrically connected to an output terminal of the gate driving unit, and a gate of the seventh transistor is electrically connected to a second timing control signal terminal. A first electrode of the seventh transistor is electrically connected to the first potential, a second electrode of the seventh transistor is electrically connected to the output terminal of the gate driving unit, a gate of the eighth transistor is electrically connected to the second electrodes of the first transistor and the second transistor, and a first electrode of the eighth transistor is electrically connected to a first timing control signal terminal of the gate driving unit. A second electrode of the eighth transistor is electrically connected to the output terminal of the gate driving unit, a first electrode of the first capacitor is electrically connected to the first electrode of the eighth transistor, the second electrode of the first capacitor is electrically connected to the gate of the third transistor, a first electrode of the second capacitor is electrically connected to the second electrodes of the first transistor and the second transistor, and a second electrode of the second capacitor is electrically connected to the output terminal of the gate driving unit. An output terminal of a preceding stage gate driving unit is electrically connected to a first input terminal of a following stage gate driving unit, and a second input terminal of the preceding stage gate driving unit is electrically connected to an output terminal of the following stage gate driving unit. The first timing control signal terminals of gate driving units in odd-numbered stages are electrically connected to each other, the second timing control signal terminals of gate driving units in even-numbered stages are electrically connected to each other, and the first timing control signal terminals of the gate driving units in odd-numbered stages and the second timing control signal terminals of the gate driving units even-numbered stages are electrically connected to a first lead terminal. The second timing control signal terminals of the gate driving units in odd-numbered stages are electrically connected to each other, the first timing control signal terminals of the gate driving units in even-numbered stages are electrically connected to each other, and the second timing control signal terminals of the gate driving units in odd-numbered stages and the first timing control signal terminals of the gate driving units in even-numbered stages are electrically connected to a second lead terminal.

DETAILED DESCRIPTION OF THE PREFERRED EMBODIMENTS

To make the purpose, features and merits more apparent and understandable, the embodiments of the disclosure are described in detail in the following in conjunction with the drawings.

To fully understand the disclosure, embodiments are described in detail in the following. The disclosure may be implemented into other embodiments different from the following embodiments, thus the disclosure is not limited to the following disclosed embodiments.

Figure 1:
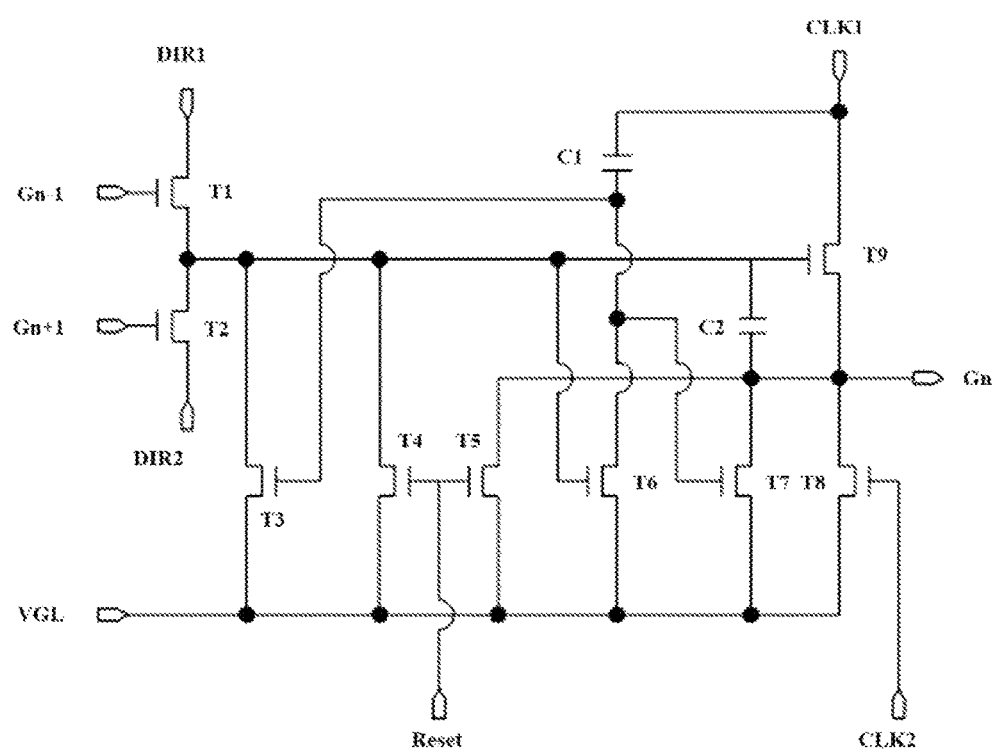
FIG. 1 is a circuit diagram of a conventional gate driving unit.
Figure 2:
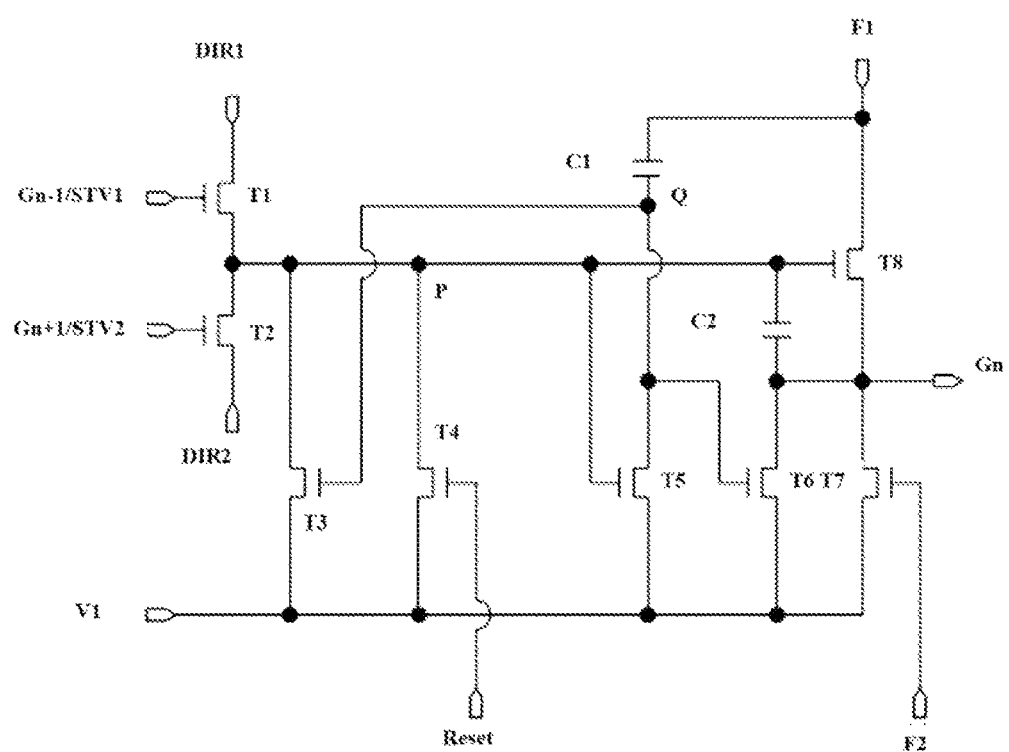
FIG. 2 is a circuit diagram of a gate driving unit according to an embodiment of the disclosure.

A gate driving unit is provided according to an embodiment of the disclosure. As shown in FIG. 2, the gate driving unit includes a first to eighth transistors T1-T8, a first capacitor C1 and a second capacitor C2.

A gate of the first transistor T1 is electrically connected to a first input terminal Gn−1/STV1, a first electrode of the first transistor T1 is electrically connected to a first scanning control signal terminal DIR1, and a second electrode of the first transistor T1 is electrically connected to a second electrode of the second transistor T2, the second electrode of the first transistor T1 and second electrode of the second transistor T2 are connected to node P.

A gate of the second transistor T2 is electrically connected to a second input terminal Gn+1/STV2, and a first electrode of the second transistor T2 is electrically connected to a second scanning control signal terminal DIR2.

The first scanning control signal terminal DIR1 and the second scanning control signal terminal DIR2 are configured to control to input the signal at the first input terminal Gn−1/STV1 or the signal at the second input terminal Gn+1/STV2 into the circuit, i.e., to implement the switching of the circuit between two scanning modes; and when being applied to a display device, the selection between two directions of scanning is enabled.

Referring to FIG. 2, a gate of the third transistor T3 is electrically connected to a second electrode of the first capacitor C1, i.e., at the node Q in the circuit; a first electrode of the third transistor T3 is electrically connected to a first potential V1, and a second electrode of the third transistor T3 is electrically connected to the second electrodes of the first transistor T1 and the second transistor T2, i.e., at the node P in the circuit.

A gate of the fourth transistor T4 is electrically connected to a reset signal terminal Reset, a first electrode of the fourth transistor T4 is electrically connected to the first potential V1, and a second electrode of the fourth transistor T4 is electrically connected to the second electrodes of the first transistor T1 and the second transistor T2, i.e., at the node P in the circuit. The fourth transistor is controlled by a reset signal to reset the circuit before a shift period.

A gate of the fifth transistor T5 is electrically connected to the second electrodes of the first transistor T1 and the second transistor T2, i.e., at the node P in the circuit; a first electrode of the fifth transistor T5 is electrically connected to the first potential V1, and a second electrode of the fifth transistor T5 is electrically connected to the second electrode of the first capacitor C1, i.e., at the node Q in the circuit.

A gate of the sixth transistor T6 is electrically connected to the second electrode of the first capacitor C1, i.e., at the node Q in the circuit; a first electrode of the sixth transistor T6 is electrically connected to the first potential V1, and the second electrode of the sixth transistor is electrically connected to an output terminal Gn of the gate driving unit.

A gate of the seventh transistor T7 is electrically connected to a second timing control signal terminal F2; a first electrode of the seventh transistor T7 is electrically connected to the first potential V1, and a second electrode of the seventh transistor T7 is electrically connected to the output terminal Gn of the gate driving unit.

A gate of the eighth transistor T8 is electrically connected to the second electrodes of the first transistor T1 and the second transistor T2, i.e., at the node P in the circuit; a first electrode of the eighth transistor T8 is electrically connected to a first timing control signal terminal F1, and a second electrode of the eighth transistor T8 is electrically connected to the output terminal Gn of the gate driving unit.

A first electrode of the first capacitor C1 is electrically connected to the first electrode of the eighth transistor T8, i.e., the first timing control signal terminal F1; and the second electrode of the first capacitor C1 is electrically connected to the gate of the third transistor T3, i.e., at the node Q in the circuit.

A first electrode of the second capacitor C2 is electrically connected to the second electrodes of the first transistor T1 and the second transistor T2, i.e., at the node P in the circuit; and a second electrode of the second capacitor C2 is electrically connected to the output terminal Gn of the gate driving unit.

Furthermore, the foregoing first to eighth transistors T1-T8 are N type transistors (NMOS), and the first potential V1 is a low potential.

In the gate driving unit according to the embodiment of the disclosure, in a reset period, a reset signal may be input into the first timing control signal terminal F1 and the second timing control signal terminal F2, i.e., once the fourth transistor T4 is turned on and it is to reset the circuit, the reset signal is input. After the reset period is finished, i.e., after the fourth transistor T4 is turned off, a first clock signal is input into the first timing control signal terminal F1, and a second clock signal is input into the second timing control signal terminal F2, where the second clock signal is a reverse signal for the first clock signal.

Figure 3:
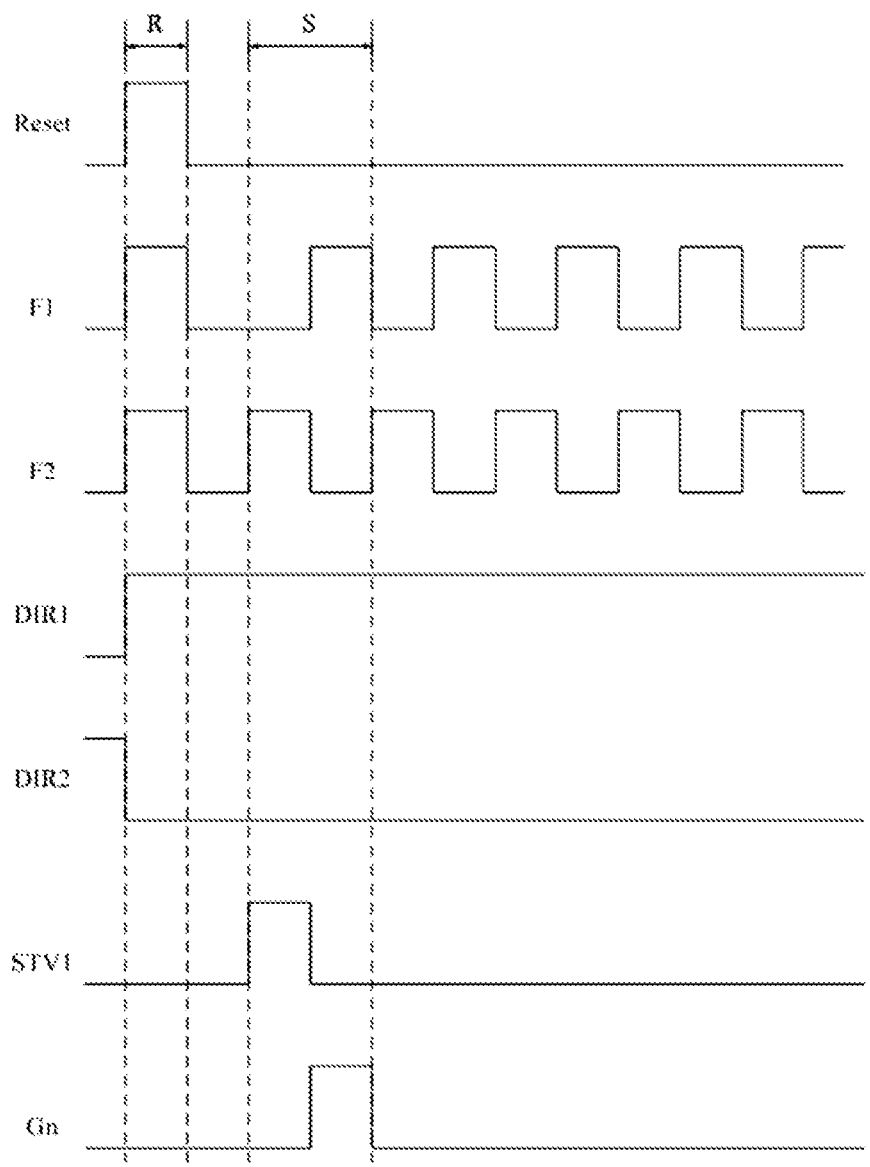
FIG. 3 is a timing diagram for operation of the gate driving unit shown in FIG. 2.

The switch from the reset signal to the clock signal at the first timing control signal terminal F1 or at the second timing control signal terminal F2 is instantaneous or non-instantaneous. As shown in FIG. 3, in a reset period R during one frame, the reset signal is input into the reset signal terminal Reset, the first timing control signal terminal F1 and the second timing control signal terminal F2; and in a shift period S during one frame, the first clock signal is input into the first timing control signal terminal F1, and the second clock signal is input into the second timing control signal terminal F2, where the second clock signal is a reverse signal for the first clock signal. There is an interval between the reset period and the shift period, and during this interval, a low potential is input into the reset signal terminal Rest, the first timing control signal terminal F1 and the second timing control signal terminal F2. According to other embodiments of the disclosure, there may be no interval between the reset period and the shift period, i.e., the gate driving unit enters into the shift period S immediately once the reset period R is finished.

FIG. 3 shows a timing diagram for respective terminals of the gate driving unit shown in FIG. 2, i.e., a timing diagram in which a high potential is input into the first scanning control signal terminal DIR1, a low potential is input into the second scanning control signal terminal DIR2, and the first potential V1 is a low potential, i.e., a signal at the first input terminal Gn–1/STV1 is input into the circuit. Alternatively, in other embodiments of the disclosure, it is also feasible to apply a low potential to the first scanning control signal terminal DIR1 and apply a high potential to the second scanning control signal terminal DIR2, i.e., a signal at the second input terminal Gn+1/STV2 is input into the circuit.

Still referring to FIG. 3, in the reset period R, the reset signal is input into the reset signal terminal Reset, the first timing control signal terminal F1 and the second timing control signal terminal F2, and the reset signal is at the high potential. In this case, the fourth transistor T4 and the seventh transistor T7 are turned on. Through the fourth transistor T4, the low potential brought by the first potential V1 is input into the node P of the circuit, thus the circuit is reset. Through the seventh transistor T7, the low potential brought by the first potential V1 is input into the output terminal Gn of the gate driving unit. The first electrode of the first capacitor C1 is electrically connected to the first timing control signal terminal F1 which is at high potential at this time, thus the first capacitor C1 begins to be charged.

In the shift period S, the first clock signal is input into the first timing control signal terminal F1, the second clock signal is input into the second timing control signal terminal F2, and an input signal, which is at high potential, is input into the first input terminal Gn–1/STV1. The first transistor T1 is turned on, and the high potential at the first scanning control signal terminal DIR1 is input into the node P. The eighth transistor T8 is turned on, and the first clock signal at the first timing control signal terminal F1 is input to the output terminal Gn of the gate driving unit; at the same time, the second clock signal at the second timing control signal terminal F2, which is at high potential, is input into the gate of the seventh transistor T7, and the seventh transistor T7 is turned on to input the low potential brought by the first potential into the output terminal Gn of the gate driving unit. In this case, the first clock signal and the first potential are both at low potential, and the output terminal Gn of the gate driving unit outputs a signal at low potential. The first electrode of the second capacitor C2 is electrically connected to the node P which is at high potential, and the second electrode of the second capacitor C2 is electrically connected to the output terminal Gn of the gate driving unit, which is at low potential, thus the second capacitor C2 is charged.

Still referring to the shift period S shown in FIG. 3, once the signal input into the first input terminal Gn–1/STV1 switches to low potential, the first transistor T1 is turned off, the high potential is kept at the node P due to discharge of the second capacitor C2, the eighth transistor T8 is turned on, and the first clock signal at the first timing control signal terminal F1 is input to the output terminal Gn of the gate driving unit; meanwhile the second clock signal at the second timing control signal terminal F2, which is at the low potential, is input to the gate of the seventh transistor T7, and the seventh transistor T7 is turned off, which causes no affection on the output at the output terminal Gn of the gate driving unit; meanwhile the low potential is kept at the node Q, and the third transistor T3 and the sixth transistor T6 are turned off, which also causes no affection on the output at the output terminal Gn of the gate driving unit; at this time, the first clock signal is at the high potential, thus the output terminal Gn of the gate driving unit outputs a signal at the high potential, i.e., in the shift period, the gate driving unit shifts the high potential of the input signal to the output terminal Gn for outputting.

Compared with a conventional gate driving unit, in the gate driving unit according to the embodiment of the disclosure, one transistor is saved while stability of the circuit in the reset period is ensured, thereby simplifying the structure of the circuit, reducing the area occupied by the gate driving unit and the area occupied by the gate driving circuit, and effectively reducing the width of the frame.

A gate driving circuit is provided according to an embodiment of the disclosure. The gate driving circuit includes multiple gate driving units according to the embodiment of the disclosure, arranged along a first direction. The case of three gate driving units is taken as an example to describe the gate driving circuit.

Figure 4:
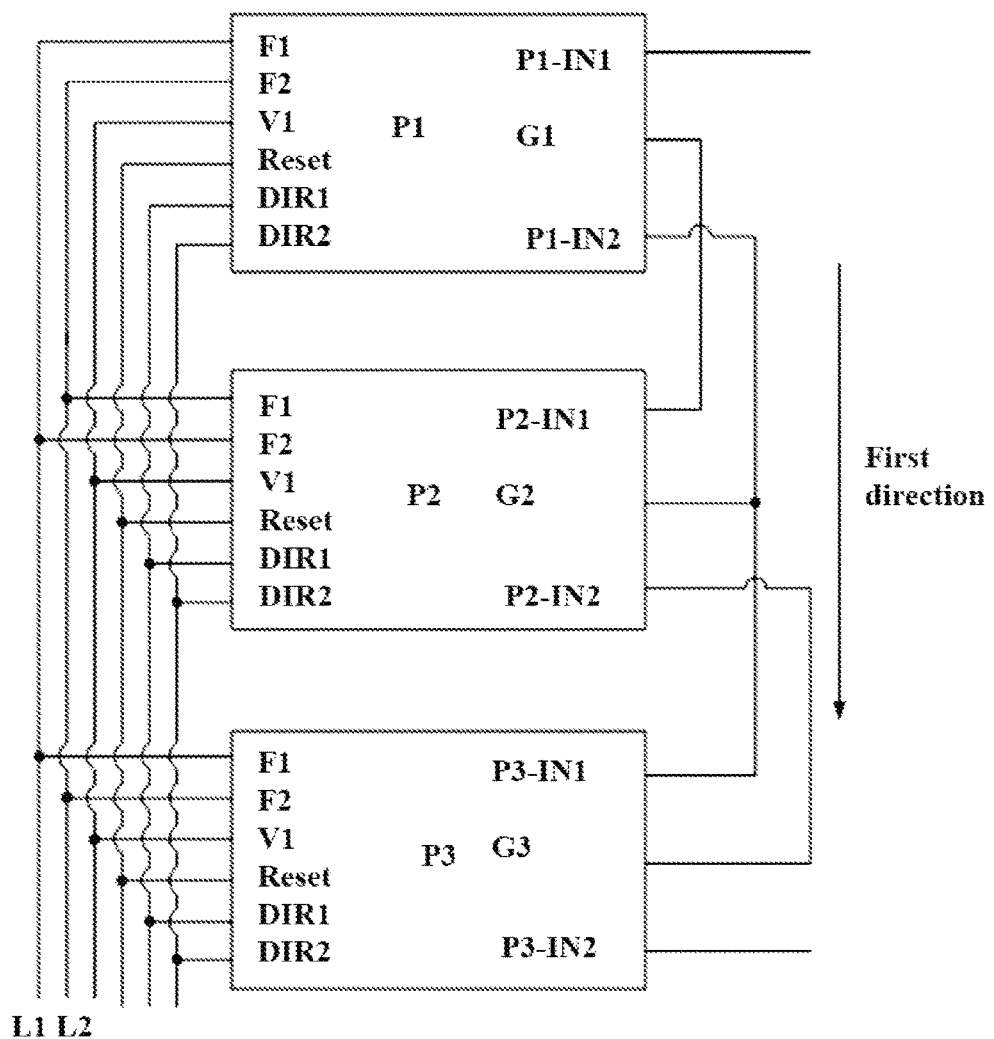
FIG. 4 is a schematic structural diagram of a gate driving circuit according to an embodiment of the disclosure.

For the gate driving units arranged along the first direction, an output terminal of a preceding stage gate driving unit is electrically connected to a first input terminal of a post-stage gate driving unit, and a second input terminal of a preceding stage gate driving unit is electrically connected to an output terminal of a post-stage gate driving unit. In FIG. 4, the three gate driving units arranged along the first direction are P1, P2 and P3 respectively.

An output terminal G1 of the first-stage gate driving unit P1 is electrically connected to a first input terminal P2-IN1 of the second-stage gate driving unit P2, and an output terminal G2 of the second-stage gate driving unit P2 is electrically connected to a first input terminal P3-IN1 of the third-stage gate driving unit P3. In other words, for the gate driving units arranged along the first direction, output terminals of preceding stage gate driving units are electrically connected to first input terminals of respective post-stage gate driving units, thus a drive signal is transmitted through the gate driving units stage by stage along the first direction.

A second input terminal P1-IN2 of the first-stage gate driving unit P1 is electrically connected to an output terminal G2 of the second-stage gate driving unit P2, and a second input terminal P2-IN2 is electrically connected to an output terminal G3 of the third-stage gate driving unit P3. In other words, for the gate driving units arranged along the first direction, output terminals of post-stage gate driving units are electrically connected to second input terminals of respective preceding stage gate driving units, thus a drive signal is transmitted through the gate driving units stage by stage along a direction opposite to the first direction.

For the gate driving units arranged along the first direction, first timing control signal terminals of gate driving units in the odd-numbered stages are electrically connected to each other, the second timing control signal terminals of the gate driving units in even-numbered stages are electrically connected to each other, and the first timing control signal terminals of the gate driving units in the odd-numbered stages and the second timing control signal terminals of the gate driving units in even-numbered stages are electrically connected to a first lead terminal. Still referring to FIG. 4, for the gate driving units arranged along the first direction, the first timing control signal terminals of the first-stage gate driving unit P1 and the third-stage gate driving unit P3 are electrically connected to each other, and the second timing control signal terminal of the second-stage gate driving unit P2 and the first timing control signal terminals of the first-stage gate driving unit P1 and the third-stage gate driving unit P3 are electrically connected to the first lead terminal L1.

The second timing control signal terminals of the gate driving units in odd-numbered stages are electrically connected to each other, the first timing control signal terminals of the gate driving units in even-numbered stages are electrically connected to each other, and the second timing control signal terminals of the gate driving units in odd-numbered stages and the first timing control signal terminals of the gate driving units in even-numbered stages are electrically connected to a second lead terminal. Still referring to FIG. 4, for the gate driving units arranged along the first direction, the second timing control signal terminals of the first-stage gate driving unit P1 and the third-stage gate driving unit P3 are electrically connected to each other, and the first timing control signal terminal of the first-stage gate driving unit P2 and the second timing control signal terminals of the first-stage gate driving unit P1 and the third-stage gate driving unit P3 are electrically connected to the second lead terminal L2.

Figure 5:
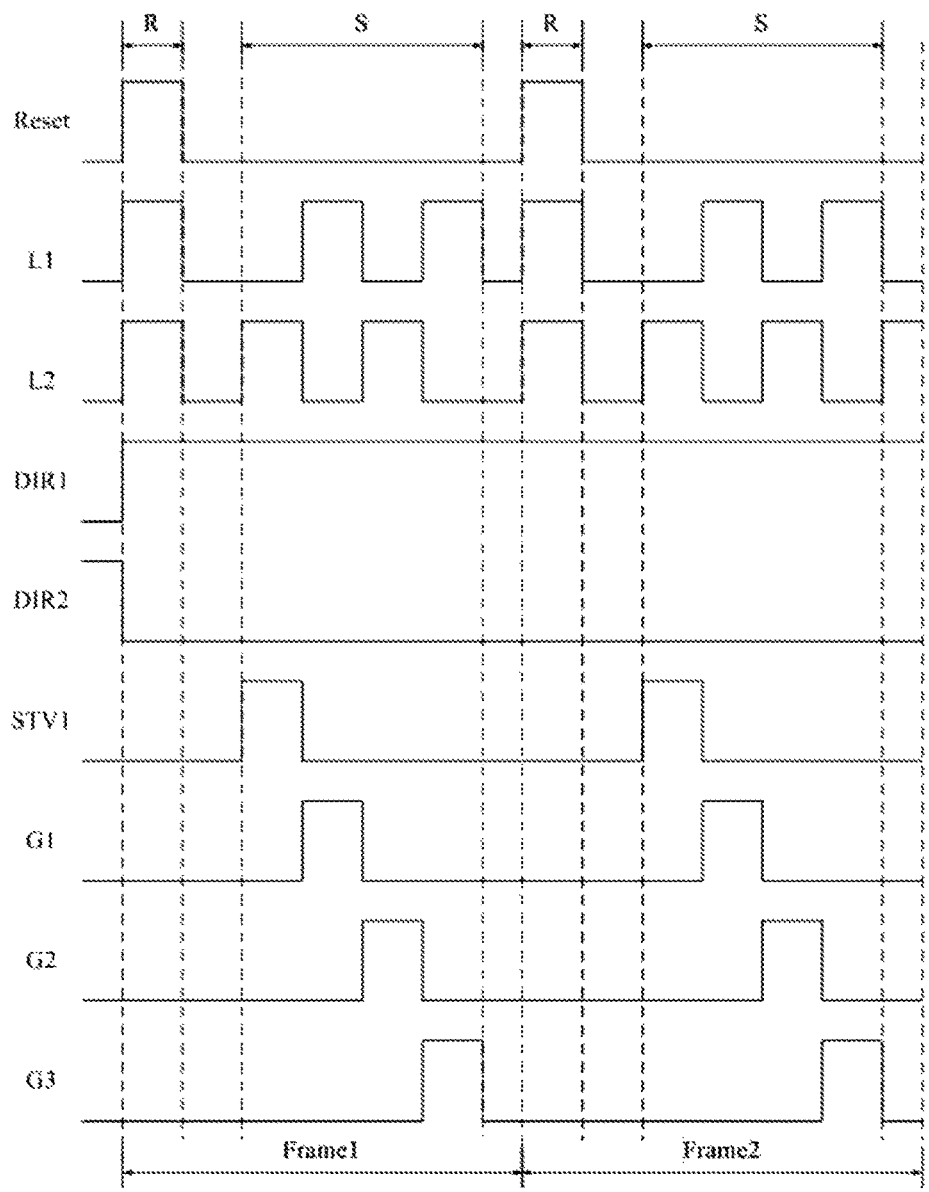
FIG. 5 is a timing diagram for operation of the gate driving circuit shown in FIG. 4 in a case that the gate driving circuit scans along a first direction.
Figure 6:
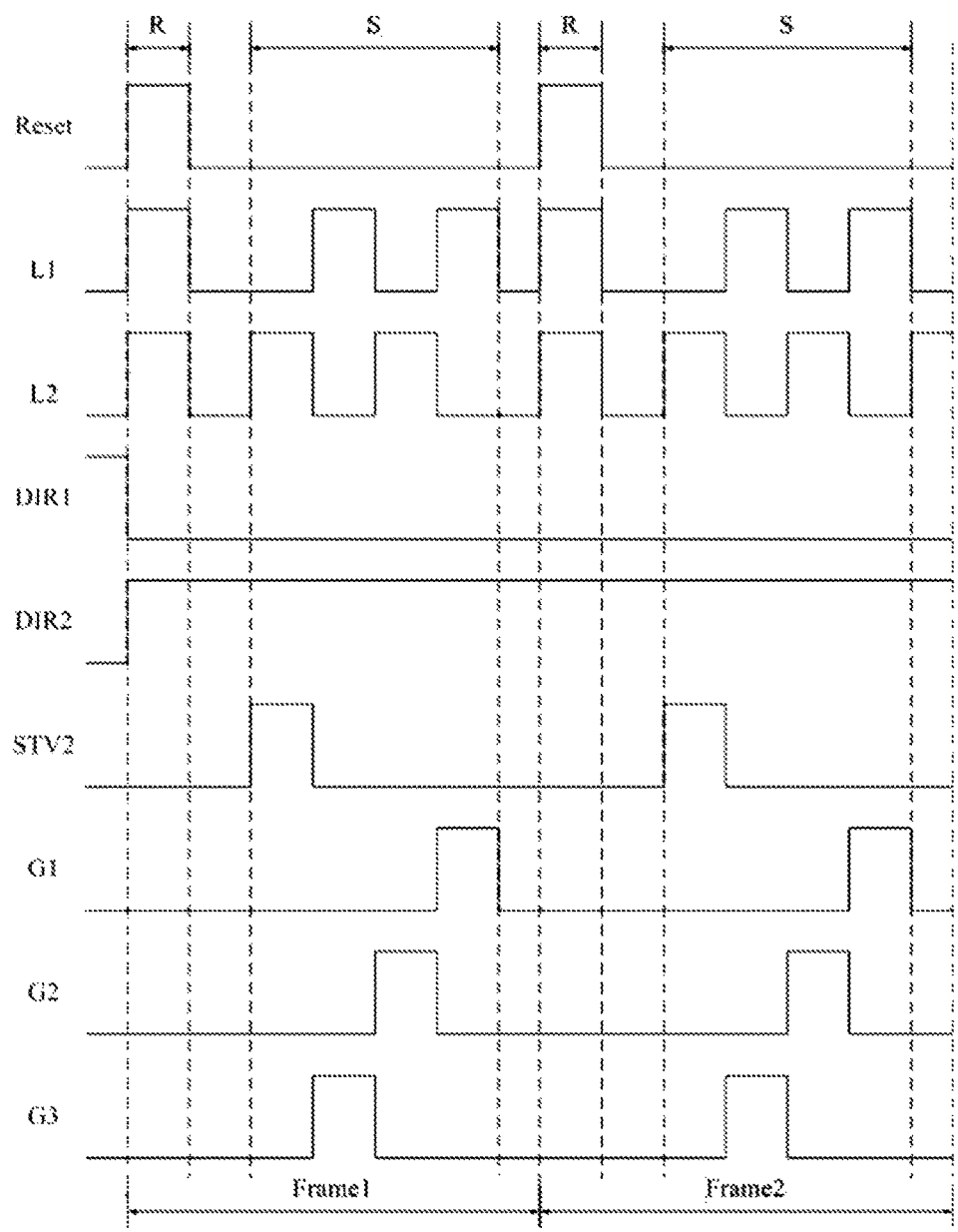
FIG. 6 is a timing diagram for operation of the gate driving circuit shown in FIG. 4 in a case that the gate driving circuit scans along a second direction.

FIG. 5 and FIG. 6 show timing diagrams for the gate driving circuit shown in FIG. 4. A first scanning control signal is input into the first scanning control signal terminal DIR1, a second scanning control signal is input into the second scanning control signal terminal DIR2, and the first potential V1 is a low potential; and the gate driving circuit may be driven along the first direction or the second direction, where the second direction is opposite to the first direction.

FIG. 5 is a timing diagram of driving along a first direction. As shown in FIG. 5, a high potential is input into the first scanning control signal terminal DIR1, a low potential is input into the second scanning control signal terminal DIR2, and first transistors for gate driving units of respective stages are turned on to input original signals for the gate driving units of respective stages. In a reset period R, the reset signal is input into the reset signal terminal Reset, the first lead terminal L1 and the second lead terminal L2; as described for the reset period R shown in FIG. 3, the reset signal is at the high potential, fourth transistors T4 of the gate driving units of respective stages are turned on to reset the whole gate driving circuit, and output terminals of the gate driving units of respective stages all output signals at low potential.

In a shift period S, a first clock signal is input into the first lead terminal L1, a second clock signal is input into to the second lead terminal L2, and an original signal is input into a first input terminal of a first one of the gate driving units along the first direction, i.e., the original signal is input into the first input terminal P1-IN1 of the first-stage gate driving unit P1 along the first direction. In a case that the original signal is at the high potential, as described for the shift period S shown in FIG. 3, the first-stage gate driving unit P1 along the first direction shifts and outputs the high potential of the original signal, i.e., the output terminal G1 of the first-stage gate driving unit P1 outputs the signal at the high potential when the potential of the original signal switches to the low potential. According to above steps, the second-stage gate driving unit P2 and the third-stage gate driving unit P3 along the first direction output signals at high potential in turn, i.e., the gate driving units are driven in turn along the first direction.

FIG. 6 is a timing diagram of driving along a second direction. As shown in FIG. 6, the low potential is input into the first scanning control terminal DIR1, the high potential is input into the second scanning control terminal DIR2, and second transistors for gate driving units of respective stages are turned on to input the original signals for respective stages driving unit. In a reset period R, the reset signal is input into the reset signal terminal Reset, the first lead terminal L1 and the second lead terminal L2; as described for the reset period R shown in FIG. 3, in this case, the reset signal is at the high potential, the fourth transistors T4 of the gate driving units of respective stages are turned on to reset the whole gate driving circuit, and the output terminals of the gate driving units of respective stages all output signals at the low potential.

In a shift period S, a first clock signal is input into the first lead terminal L1, a second clock signal is input into the second lead terminal L2, and an original signal is input into a second input terminal of a first one of the gate driving units along the second direction, i.e., the original signal is input into the second input terminal P3-IN1 of the first-stage gate driving unit P3 along the second direction. In a case that the original signal is at the high potential, this case differs from the shift period S shown in FIG. 3 only in that the original signal is input into a different terminal, and operation of the gate driving unit P3 in the shift period is the same as that shown in FIG. 3, thus the first-stage gate driving unit P3 along the second direction shifts and outputs the high potential of the original signal, i.e., the output terminal G3 of the gate driving unit P3 outputs the signal at the high potential when the potential of the original signal switches to the low potential. According to above steps, the second-stage gate driving unit P2 and the third-stage gate driving unit P1 along the second direction output signals at the high potential in turn, i.e., the gate driving units are driven in turn along the second direction.

In the method for driving the gate driving circuit according to the embodiment of the disclosure, corresponding signals are input into the first lead terminal and second lead terminal in different periods; in the reset period, the reset signal is input into the timing control signal terminals electrically connected to the first lead terminal and the second lead terminal to reset and stabilize the circuit; and in the shift period, the clock signals are input into the timing control signal terminals electrically connected to the first lead terminal and the second lead terminal to realize shift functions of respective gate driving circuits. With this intelligent method for inputting signals, no extra transistor is needed, the area of the gate driving circuit is effectively reduced, and the width for the frame is reduced.

Figure 7:
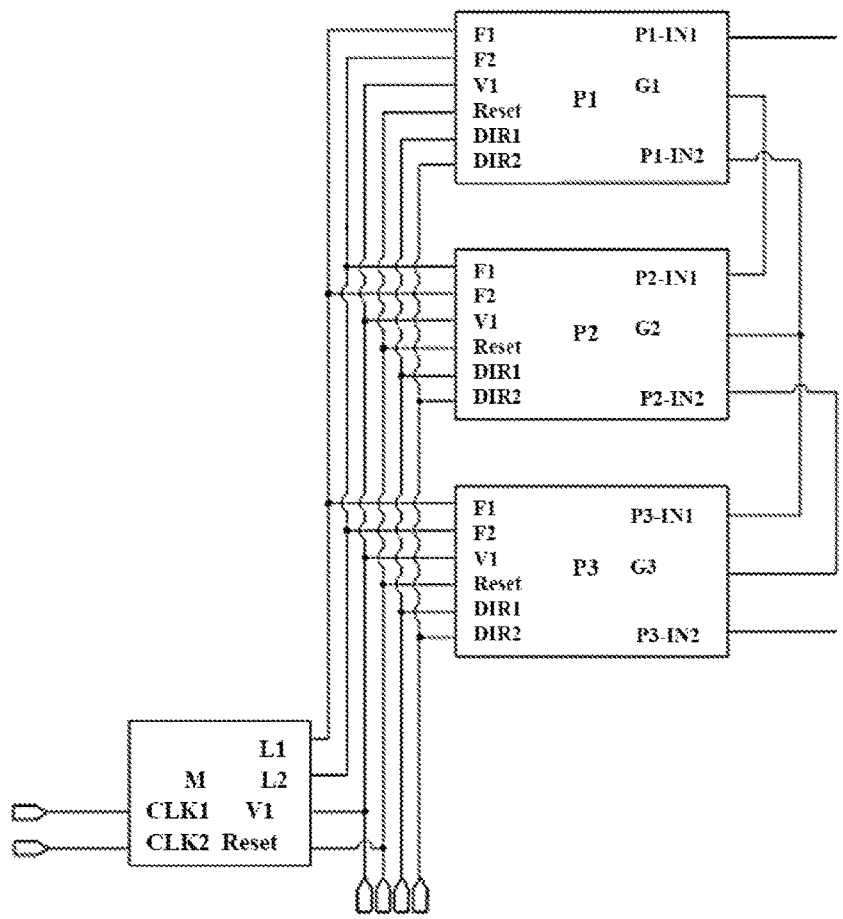
FIG. 7 is a schematic structural diagram of a gate driving circuit according to another embodiment of the disclosure.

Another gate driving circuit is provided according to an embodiment of the disclosure. Besides multiple gate driving units arranged along the first direction, the gate driving circuit further includes a signal conversion unit. FIG. 7 schematically shows the connection between the signal conversion unit and the cascaded gate driving units.

As shown in FIG. 7, connections between the gate driving units of respective stages are the same as those shown in FIG. 4, the first lead terminal L1 and the second lead terminal L2 are electrically connected to two output terminals of the signal conversion unit, and the signal conversion unit further includes: a first clock signal terminal CLK1, a second clock signal terminal CLK2, a reset signal terminal and a first potential. In other words, a clock signal input into the first clock signal terminal CLK1 is converted by the signal conversion unit and then is directly output to the first lead terminal L1, and a clock signal input into the second clock signal terminal CLK2 is converted by the signal conversion unit and then is directly output to the second lead terminal L2, thus there is no need to input different signals into the first lead terminal L1 and the second lead terminal L2 in different periods.

Figure 8:
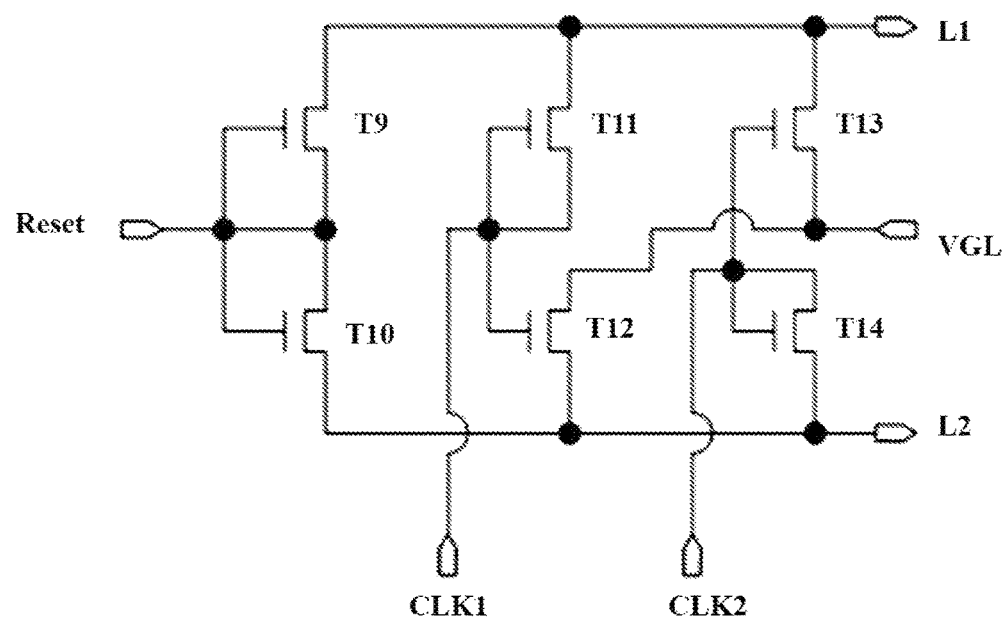
FIG. 8 is a circuit diagram of a signal conversion unit of the gate driving circuit shown in FIG. 7.

FIG. 8 shows a circuit for the signal conversion unit shown in FIG. 7. As shown in FIG. 8, the signal conversion unit includes a ninth to fourteenth transistors T9-T14.

A gate and a first electrode of the ninth transistor are electrically connected to the reset signal terminal Reset, and a second electrode of the ninth transistor T9 is electrically connected to the first lead terminal L1.

A gate and a first electrode of the tenth transistor T10 are electrically connected to the reset signal terminal Reset, and a second electrode of the tenth transistor T10 is electrically connected to the second lead terminal L2.

A gate and a first electrode of the eleventh transistor T11 are electrically connected to a first clock signal terminal CLK1, and a second electrode of the eleventh transistor T11 is electrically connected to the first lead terminal L1.

A gate of the twelfth transistor T12 is electrically connected to the first clock signal terminal CLK1, a first electrode of the twelfth transistor T12 is electrically connected to the first potential V1, and a second electrode of the twelfth transistor T12 is electrically connected to the second lead terminal L2.

A gate of a thirteenth transistor T13 is electrically connected to a second clock signal terminal CLK2, a first electrode of the thirteenth transistor T13 is electrically connected to the first potential V1, and a second electrode of the thirteenth transistor T13 is electrically connected to the first lead terminal L1.

A gate and a first electrode of the fourteenth transistor T14 are electrically connected to the second clock signal terminal CLK2, and a second electrode of the fourteenth transistor T14 is electrically connected to the second lead terminal L2.

Furthermore, the ninth transistor T9 to the fourteenth transistor T14 are N type transistors (NMOS), and the first potential is a low potential.

In a case that the first clock signal and the second clock signal input into the signal conversion unit are at low potential, the eleventh transistor T11 to the fourteenth transistor T14 are all turned off, a reset signal input into the reset signal terminal Reset is directly transmitted to the first lead terminal L1 and the second lead terminal L2. In a case that the first clock signal is reverse to the second clock signal, the eleventh transistor T11 and the twelfth transistor T12 are turned on, and the thirteenth transistor T13 and the fourteenth transistor T14 are turned off, or, the eleventh transistor T11 and the twelfth transistor T12 are turned off, and the thirteenth transistor T13 and the fourteenth transistor T14 are turned on. In a case that the eleventh transistor T11 to the fourteenth transistor T14 are all N type transistors, only the transistors for which the gate is connected to a clock signal at high potential, are turned on. In this case, through the on-state transistor of which the first electrode is electrically connected to the gate, the signal at the high potential may be transmitted to the first lead terminal L1 or second lead terminal L2, and through another on-state transistor of which the first electrode is electrically connected to the first potential, the low potential signal at the first potential is transmitted to the other lead terminal, which is equivalent to the case that the clock signal at the low potential is also transmitted to the first lead terminal L1 or the second lead terminal L2.

In a case that the first clock signal is at the low potential and the second clock signal is at the high potential, the eleventh transistor T11 and the twelfth transistor T12 are turned on, and the thirteenth transistor T13 and the fourteenth transistor T14 are turned off. Through the eleventh transistor T11, the first clock signal at the high potential is transmitted to the first lead terminal L1, and through the twelfth transistor T12, the low potential is input into the second lead terminal L2, which is equivalent to the case that the second clock signal at the low potential at this time point is transmitted to the second lead terminal L2.

In a case that the first clock signal is at the high potential and the second clock signal is at the low potential, the eleventh transistor T11 and the twelfth transistor T12 are turned off, and the thirteenth transistor T13 and the fourteenth transistor T14 are turned on. Through the fourteenth transistor T14, the second clock signal at the high potential is transmitted to the second lead terminal L2, and through the thirteenth transistor, the low potential is input into the first lead terminal L1, which is equivalent to the case that the first clock signal at the low potential at this time point is transmitted to the first lead terminal L1.

Therefore, with the signal conversion unit, it is only needed to provide the first clock signal and the second clock to make the signals input through the first lead terminal L1 and the second lead terminal L2 satisfy requirement of the circuit, i.e., there is no need to input different signals into the first lead terminal L1 and the second lead terminal L2 in different periods.

Figure 9:
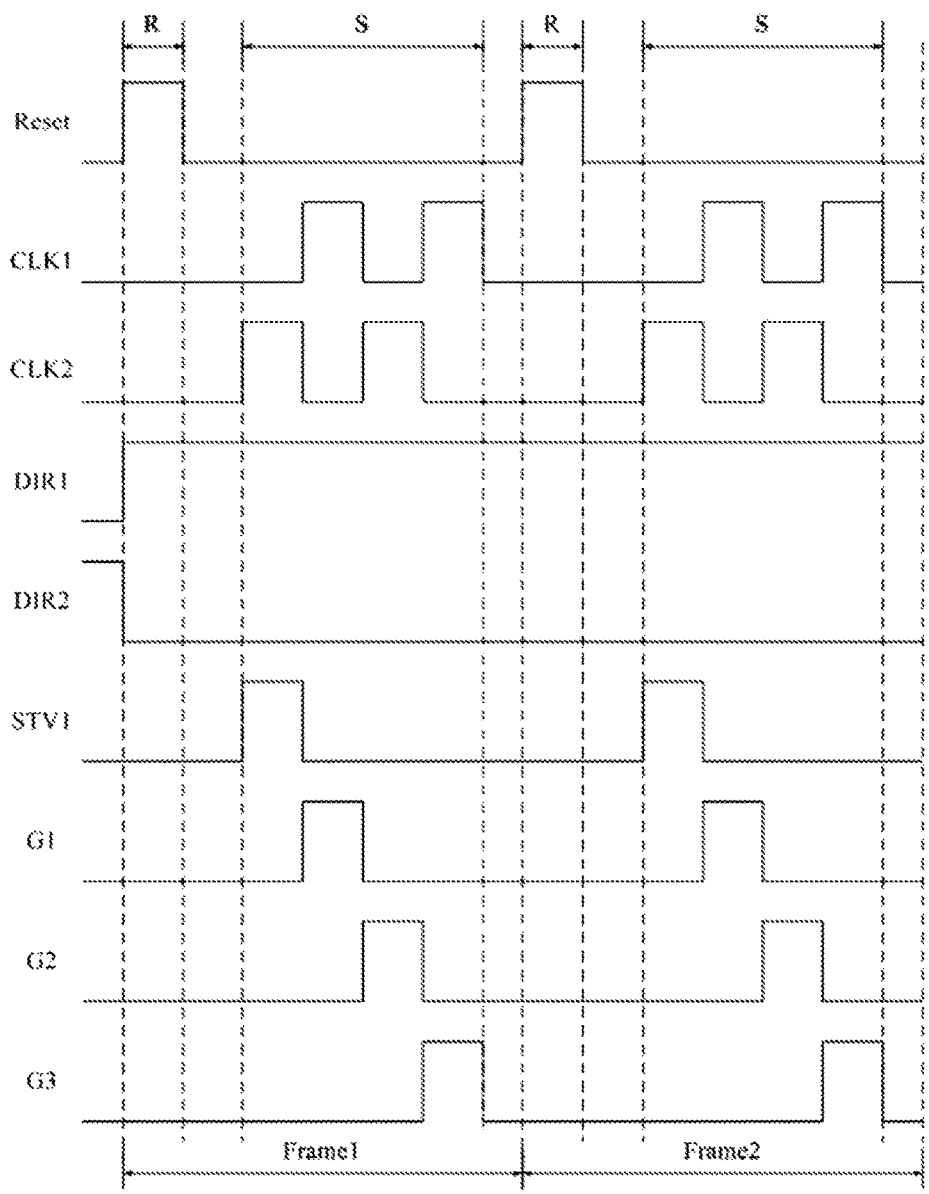
FIG. 9 is a timing diagram for operation of the gate driving circuit shown in FIG. 7 in a case that the gate driving circuit scans along a first direction.
Figure 10:
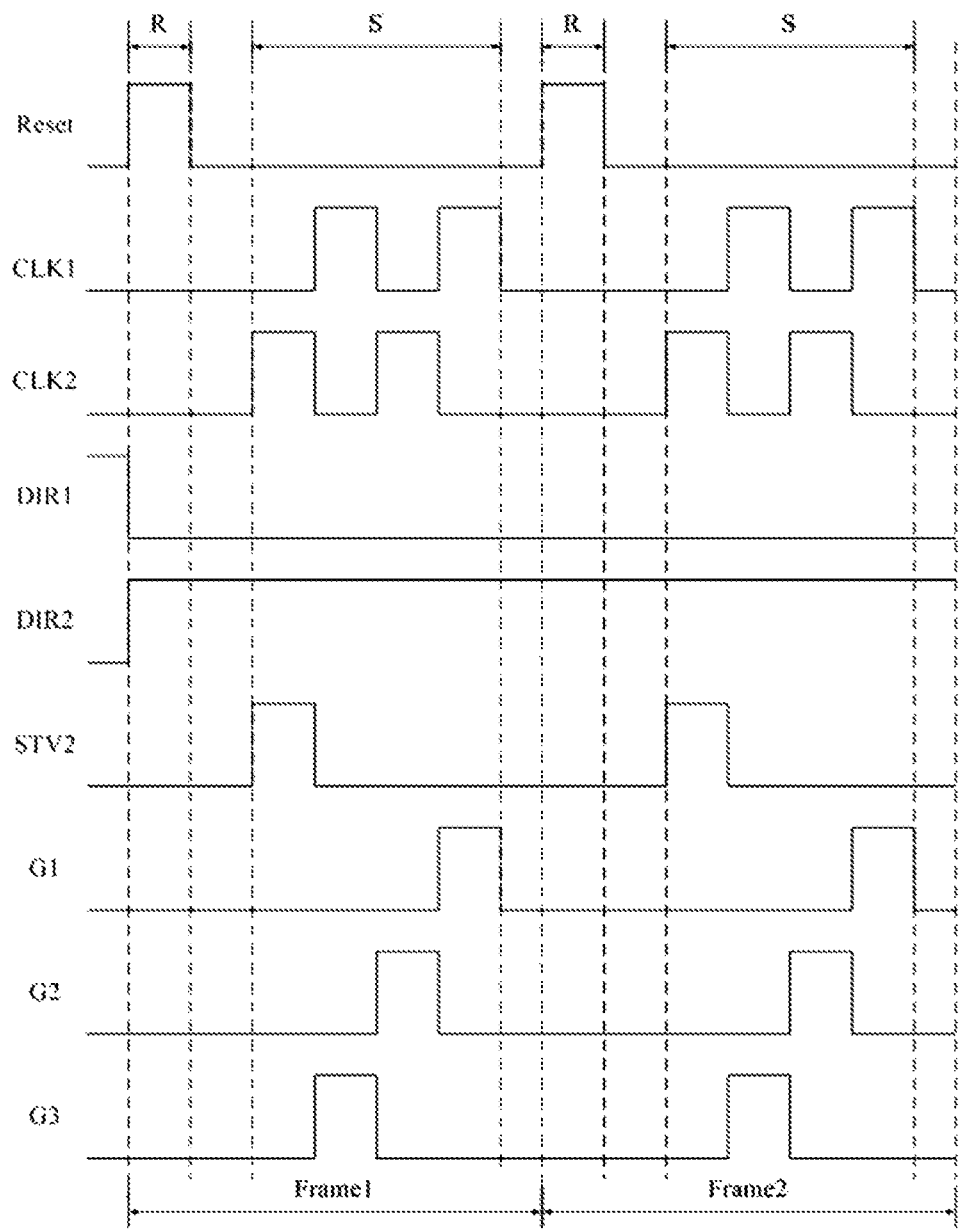
FIG. 10 is a timing diagram for operation of the gate driving circuit shown in FIG. 7 in a case that the gate driving circuit scans along a second direction.

FIG. 9 and FIG. 10 show timing diagrams for the gate driving circuit shown in FIG. 7. A first scanning control signal is input into first scanning control terminal DIR1, a second scanning control signal is input into second scanning control terminal DIR2, and the first potential V1 is at a low potential; and the gate driving circuit may be driven along the first direction or the second direction, where the second direction is opposite to the first direction.

FIG. 9 is a timing diagram of driving along a first direction. As shown in FIG. 9, the high potential is input into the first scanning control terminal DIR1, the low potential is input into the second scanning control terminal DIR2, and first transistors for gate driving units of respective stages are turned on to input original signals for the gate driving units of respective stages. In the reset period R, the reset signal is input into reset signal terminal Reset. As described for the reset period R shown in FIG. 3, the reset signal is at the high potential at this time, fourth transistors T4 for the gate driving units of respective stages are turned off, the whole gate driving circuit is reset, and output terminals of the gate driving units all output signals at the low potential.

The first clock signal is input into the first clock signal terminal CLK1, and is transmitted to the first lead terminal L1 via the signal conversion unit; and the second clock signal is input into the second clock signal terminal CLK2 and is transmitted to the second lead terminal L2 via the signal conversion unit. An original signal is input into the first input terminal of the first one of the gate driving units along the first direction, i.e., the original signal is input into the first input terminal P1-IN1 of the first-stage gate driving unit P1 along the first direction. In a case that the original signal is at the high potential, as described for the shift period S shown in FIG. 3, the first-stage gate driving unit P1 along the first direction shifts and outputs the original signal at high potential, i.e., the output terminal G1 of the first-stage gate driving unit P1 outputs the signal at the high potential when the original signal switches to the low potential. According to above steps, the second-stage gate driving unit P2 and the third-stage gate driving unit P3 along the first direction output signals at the high potential in turn, i.e., the gate driving units are driven in turn along the first direction.

FIG. 10 is a timing diagram of driving along a second direction. As shown in FIG. 6, a signal at the low potential is input into the first scanning control terminal DIR1, a signal at the high potential is input into the second scanning control terminal DIR2, and second transistors for gate driving units of respective stages are turned on to input original signals for the gate driving units of respective stages. In a reset period R, the reset signal is input into the reset signal terminal Reset. As described for the reset period R shown in FIG. 3, the reset signal is at the high potential at this time, fourth transistors T4 for the gate driving units of respective stages are turned on, the whole gate driving circuit is reset, and output terminals of the gate driving units of respective stages all output signals at the low potential.

In a shift period S, the first clock signal is input into the first clock signal terminal CLK1, and is transmitted to the first lead terminal L1 via the signal conversion unit; the second clock signal is input into the second clock signal terminal CLK2 and is transmitted to the second lead terminal L2 via the signal conversion unit. An original signal is input into the second input terminal of the first one of the gate driving units along the second direction, i.e., the original signal is input into the second input terminal P3-IN1 of the first-stage gate driving unit P3 along the second direction. In a case that the original signal is at the high potential, this case differs from the shift period S shown in FIG. 3 only in that the original signal is input into a different terminal, and operation of the gate driving unit P3 in the shift period is the same as that shown in FIG. 3, thus the first-stage gate driving unit P3 along the second direction shifts and outputs the original signal at the high potential, i.e., the output terminal G3 of the gate driving unit P3 outputs the signal at the high potential when the original signal switches to the low potential. According to above steps, the second-stage gate driving unit P2 and the third-stage gate driving unit P1 along the second direction output signals at the high potential in turn, i.e., the gate driving units are driven in turn along the second direction.

In the method for driving the gate driving circuit according to the embodiment of the disclosure, by introducing the signal conversion unit to perform conversion on the clock signals, corresponding signals may be provided to the first lead terminal and the second lead terminal in different periods, the separate operations to input different signals into the first lead terminal and the second lead terminal in respective periods may be avoided, thus operation is more simple and convenience; and with this method, by introducing the signal conversion unit, one transistor may be saved in the gate driving unit of each stage, thereby effectively reducing the area of the gate driving circuit, and reducing the width of the frame.

Figure 11:
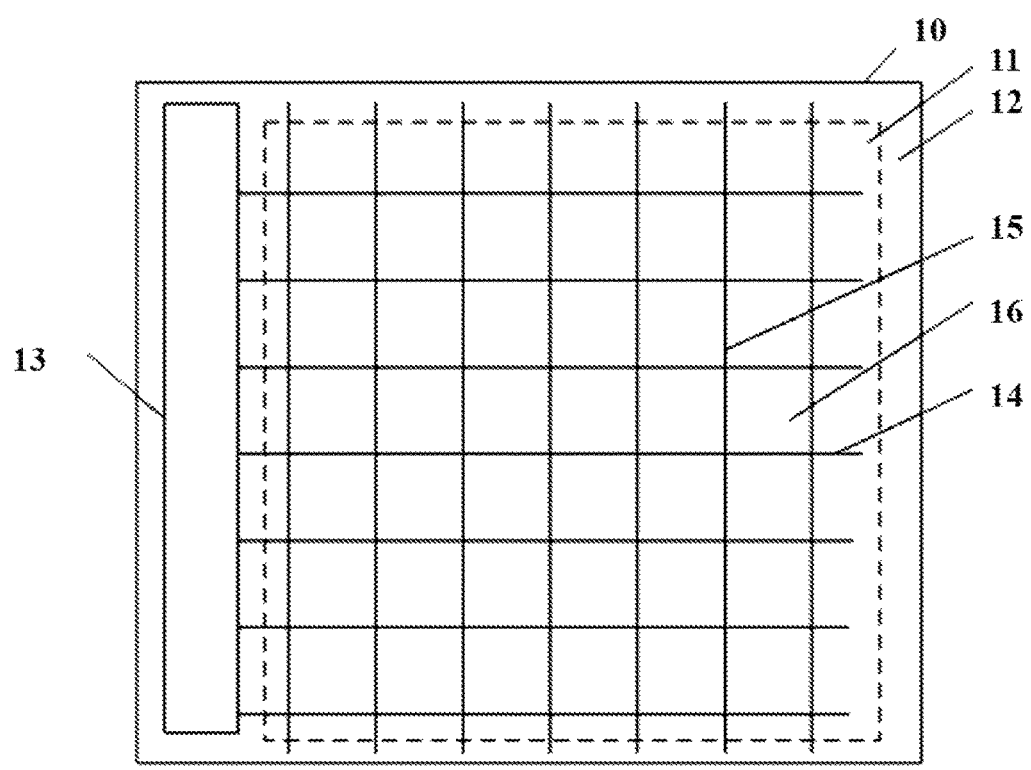
FIG. 11 is a top view of a display device according to an embodiment of the disclosure.
Figure 12:
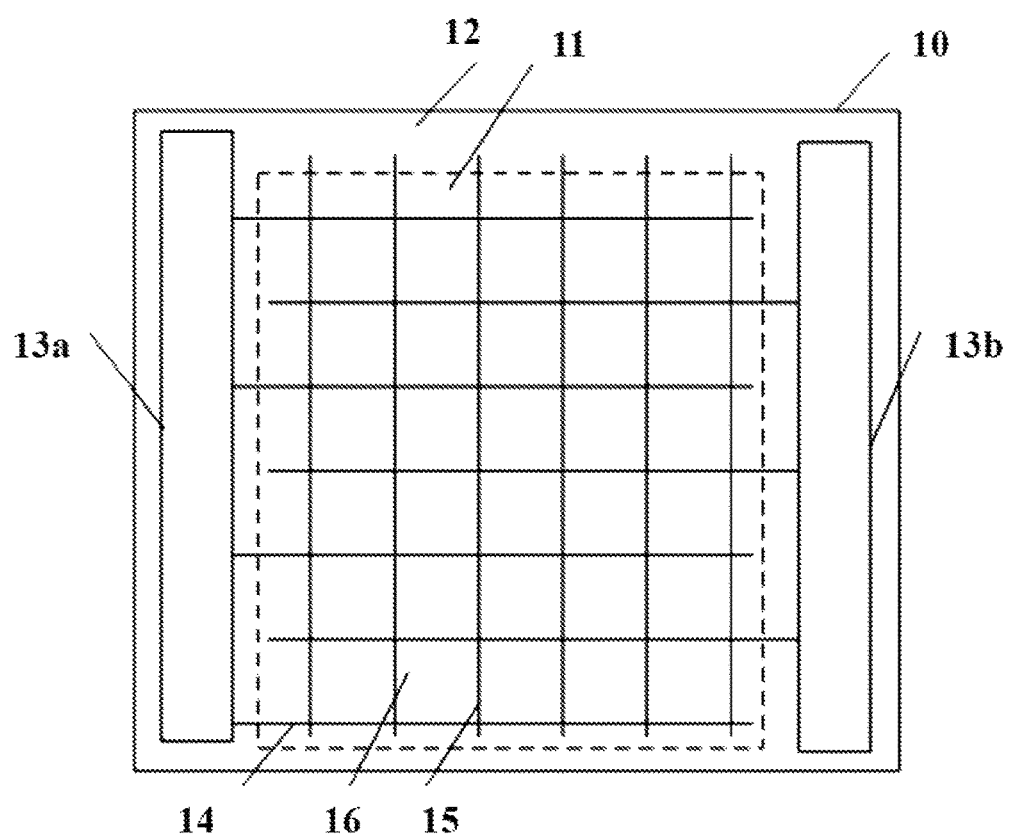
FIG. 12 is a top view of a display device according to another embodiment of the disclosure.

A display device is provided according to the disclosure. The display device includes: a display region and a frame region surrounding the display region, where a portion of the frame region on at least one side of the display region is provided with a gate driving circuit according to the embodiment of the disclosure. As shown in FIG. 11 and FIG. 12, the display device includes the display region 11 and the frame region 12 surrounding the display region. As shown in FIG. 11, a portion of the frame region 12 at one side of the display region 11 is provided with a gate driving circuit 13, i.e., the display device is driven from a single side. As shown in FIG. 12, the frame region 12 at two sides of the display region 11 are provided with gate driving circuits 13a and 13b, i.e., the display device is driven from two sides. Besides providing one gate driving circuit for driving from a single side and providing one gate driving circuits at each sides for driving from two sides, multiple gate driving circuits may be provided at one side, or gate driving circuits may be provided in frame region at other sides.

Furthermore, as show in FIG. 11 and FIG. 12, the display region 11 includes multiple scanning lines 14, multiple data lines 15 and an array pixel region 16 surrounded by the scanning lines 14 and the data lines 15, where an output terminal of a gate driving unit of each stage in the gate driving circuit, the gate driving circuit 13a or the gate driving circuit 13b is electrically connected to one scanning line 14.

With the display device according to the embodiment of the disclosure, one transistor is saved in the gate driving unit of each stage in the gate driving circuit, thus the gate driving unit and the gate driving circuit occupy less area, thereby effectively reducing the width of the frame. In addition, in case of a limited width of the frame, the display device according to the embodiment of the disclosure is beneficial for achieving higher resolution.

It should be noted that the foregoing embodiments may refer to each other and may be used in combination. Preferred embodiments of the disclosure are disclosed in the foregoing and are not meant to limit the disclosure. With the disclosed method and technical content, some alternations and modifications may be made on the technical solutions of the disclosure by any person of skills in the art without departing from the spirit and scope of the disclosure. Hence, any simple modification, alternative and alternation made based on the technical essence disclosed herein without departing from the technical solutions of the disclosure fall within the scope of the technical solutions of the disclosure.

What is claimed is:

1. A gate driving circuit comprising a gate driving unit and a signal conversion unit,
    the gate driving unit comprising:
        first, second, third, fourth, fifth, sixth, seventh, and eighth transistors; and
        first and second capacitors, wherein:
        a gate of the first transistor is electrically connected to a first input terminal of the gate driving unit,
        a first electrode of the first transistor is electrically connected to a first scanning control signal terminal of the gate driving unit,
        a second electrode of the first transistor is electrically connected to a second electrode of the second transistor,
        a gate of the second transistor is electrically connected to a second input terminal of the gate driving unit,
        a first electrode of the second transistor is electrically connected to a second scanning control signal terminal of the gate driving unit, a gate of the third transistor is electrically connected to a second electrode of the first capacitor,
a first electrode of the third transistor is electrically connected to a first potential,
a second electrode of the third transistor is electrically connected to the second electrodes of the first and second transistors,
a gate of the fourth transistor is electrically connected to a reset signal terminal of the gate driving unit and receives a reset signal,
a first electrode of the fourth transistor is electrically connected to the first potential,
a second electrode of the fourth transistor is electrically connected to the second electrodes of the first and second transistors,
a gate of the fifth transistor is electrically connected to the second electrodes of the first and second transistor,
a first electrode of the fifth transistor is electrically connected to the first potential,
a second electrode of the fifth transistor is electrically connected to the second electrode of the first capacitor,
a gate of the sixth transistor is electrically connected to the second electrode of the first capacitor,
a first electrode of the sixth transistor is electrically connected to the first potential,
the second electrode of the sixth transistor is electrically connected to an output terminal of the gate driving unit;
a gate of the seventh transistor is electrically connected to a second timing control signal terminal of the gate driving unit,
a first electrode of the seventh transistor is electrically connected to the first potential,
a second electrode of the seventh transistor is electrically connected to the output terminal of the gate driving unit,
a gate of the eighth transistor is electrically connected to the second electrodes of the first and second transistors
a first electrode of the eighth transistor is electrically connected to a first timing control signal terminal of the gate driving unit,
a second electrode of the eighth transistor is electrically connected to the output terminal of the gate driving unit,
a first electrode of the first capacitor is electrically connected to the first electrode of the eighth transistor,
the second electrode of the first capacitor is electrically connected to the gate of the third transistor,
a first electrode of the second capacitor is electrically connected to the second electrodes of the first and second transistors, and
a second electrode of the second capacitor is electrically connected to the output terminal of the gate driving unit; and
the signal conversion unit receiving a first clock signal, a second clock signal, the first potential and the reset signal, and providing a first timing control signal to the first timing control signal terminal and a second timing control signal to the second timing control signal terminal or providing the first timing control signal to the second timing control signal terminal and the second timing control signal to the first timing control signal terminal.

2. The gate driving circuit according to claim 1, wherein the first transistor, the second transistor, the third transistor, the fourth transistor, the fifth transistor, the sixth transistor, the seventh transistor, and the eighth transistor are N type transistors, and wherein the first potential is a low potential.

3. The gate driving circuit according to claim 1, wherein:
the reset signal is input to the first timing control signal terminal and to the second timing control signal terminal while the fourth transistor is turned on;
the first clock signal is input into the first timing control signal terminal while the fourth transistor is turned off, and
the second clock signal is input into the second timing control signal terminal while the fourth transistor is turned off; and
the second clock signal is of opposite polarity to the polarity of the first clock signal.

4. A gate driving circuit comprising a plurality of gate driving units arranged along a first direction and a signal conversion unit, wherein:
each of the gate driving units comprises a first transistor, a second transistor, a third transistor, a fourth transistor, a fifth transistor, a sixth transistor, a seventh transistor, an eighth transistor, a first capacitor and a second capacitor, wherein:
a gate of the first transistor is electrically connected to a first input terminal of the gate driving unit,
a first electrode of the first transistor is electrically connected to a first scanning control signal terminal of the gate driving unit,
a second electrode of the first transistor is electrically connected to a second electrode of the second transistor,
a gate of the second transistor is electrically connected to a second input terminal of the gate driving unit,
a first electrode of the second transistor is electrically connected to a second scanning control signal terminal of the gate driving unit,
a gate of the third transistor is electrically connected to a second electrode of the first capacitor,
a first electrode of the third transistor is electrically connected to a first potential,
a second electrode of the third transistor is electrically connected to the second electrodes of the first transistor and the second transistor;
a gate of the fourth transistor is electrically connected to a reset signal terminal of the gate driving unit and receives a reset signal,
a first electrode of the fourth transistor is electrically connected to the first potential,
a second electrode of the fourth transistor is electrically connected to the second electrodes of the first transistor and the second transistor,
a gate of the fifth transistor is electrically connected to the second electrodes of the first transistor and the second transistor,
a first electrode of the fifth transistor is electrically connected to the first potential,
a second electrode of the fifth transistor is electrically connected to the second electrode of the first capacitor,
a gate of the sixth transistor is electrically connected to the second electrode of the first capacitor,
a first electrode of the sixth transistor is electrically connected to the first potential, the second electrode of the sixth transistor is electrically connected to an output terminal of the gate driving unit, a gate of the seventh transistor is electrically connected to a second timing control signal terminal of the gate driving unit, a first electrode of the seventh transistor is electrically connected to the first potential, a second electrode of the seventh transistor is electrically connected to the output terminal of the gate driving unit, a gate of the eighth transistor is electrically connected to the second electrodes of the first transistor and the second transistor, a first electrode of the eighth transistor is electrically connected to a first timing control signal terminal, a second electrode of the eighth transistor is electrically connected to the output terminal of the gate driving unit, a first electrode of the first capacitor is electrically connected to the first electrode of the eighth transistor, the second electrode of the first capacitor is electrically connected to the gate of the third transistor, a first electrode of the second capacitor is electrically connected to the second electrodes of the first transistor and the second transistor, a second electrode of the second capacitor is electrically connected to the output terminal of the gate driving unit, an output terminal of a preceding stage gate driving unit is electrically connected to a first input terminal of a following stage gate driving unit, a second input terminal of the preceding stage gate driving unit is electrically connected to an output terminal of the following stage gate driving unit, the first timing control signal terminals of gate driving units in odd-numbered stages are electrically connected to each other, the second timing control signal terminals of gate driving units in even-numbered stages are electrically connected to each other, the first timing control signal terminals of the gate driving units in odd-numbered stages and the second timing control signal terminals of the gate driving units in even-numbered stages are electrically connected to a first lead terminal, the second timing control signal terminals of the gate driving units in odd-numbered stages are electrically connected to each other, the first timing control signal terminals of the gate driving units in even-numbered stages are electrically connected to each other, and the second timing control signal terminals of the gate driving units in odd-numbered stages and the first timing control signal terminals of the gate driving units in even-numbered stages are electrically connected to a second lead terminal; and the signal conversion unit receives a first clock signal, a second clock signal, the first potential and the reset signal, and providing a first signal to the first lead terminal and a second signal to the second lead terminal.

5. The gate driving circuit according to claim 4, wherein the signal conversion unit comprises ninth to fourteenth transistors, wherein:

a gate and a first electrode of the ninth transistor are electrically connected to the reset signal terminals of the gate driving units, a second electrode of the ninth transistor is electrically connected to the first lead terminal;

a gate and a first electrode of the tenth transistor are electrically connected to the reset signal terminals of the gate driving units, and a second electrode of the tenth transistor is electrically connected to the second lead terminal;

a gate and a first electrode of the eleventh transistor are electrically connected to a first clock signal terminal, a second electrode of the eleventh transistor is electrically connected to the first lead terminal;

a gate of the twelfth transistor is electrically connected to the first clock signal terminal, a first electrode of the twelfth transistor is electrically connected to the first potential, a second electrode of the twelfth transistor is electrically connected to the second lead terminal;

a gate of the thirteenth transistor is electrically connected to a second clock signal terminal, a first electrode of the thirteenth transistor is electrically connected to the first potential, a second electrode of the thirteenth transistor is electrically connected to the first lead terminal, a gate and a first electrode of the fourteenth transistor are electrically connected to the second clock signal terminal, and a second electrode of the fourteenth transistor is electrically connected to the second lead terminal.

6. The gate driving circuit according to claim 5, wherein the ninth to the fourteenth transistors are N type transistors, and the first potential is a low potential.

7. The gate driving circuit according to claim 4, wherein:
a first scanning control signal is input into the first scanning control signal terminal,
a second scanning control signal is input into the second scanning control signal terminal,
the gate driving circuit is controlled to scan along the first direction or a second direction, and
the second direction is opposite to the first direction.

8. The gate driving circuit according to claim 5, wherein:
a first scanning control signal is input into the first scanning control signal terminal,
a second scanning control signal is input into the second scanning control signal terminal,
the gate driving circuit is controlled to scan along the first direction or a second direction, and
the second direction is opposite to the first direction.

9. The gate driving circuit according to claim 4, wherein:
during a reset period, the reset signal is input to the reset signal terminals, to the first lead terminal, and to the second lead terminal; and
during a shift period, the first clock signal is input to the first lead terminal, and the second clock signal is input to the second lead terminal.

10. The gate driving circuit according to claim 9, wherein:
when the gate driving circuit is driven along the first direction, an original signal is input into a first input terminal of a first one of the gate driving units along the first direction.

11. The gate driving circuit according to claim 9, wherein:
when the gate driving circuit is driven along the second direction, an original signal is input to a first input terminal of a first one of the gate driving units along the second direction.

12. The gate driving circuit according to claim 4, wherein:
during a reset period, the reset signal is input to the reset signal terminals; and
during a shift period, the first clock signal is input to the first clock signal terminal, and the second clock signal is input to the second clock signal terminal.

13. The gate driving circuit according to claim 12, wherein:
when the gate driving circuit is driven along the first direction, an original signal is input to a first input terminal of a first one of the gate driving units along the first direction.

14. The gate driving circuit according to claim 12, wherein:
when the gate driving circuit is driven along the first direction, an original signal is input to a first input terminal of a first one of the gate driving units along the second direction.

15. The gate driving circuit according to claim 4, wherein:
the first signal is provided to the first timing control signal terminals of the gate driving units in odd-numbered stages and the second timing control signal terminals of the gate driving units in even-numbered stages; and
the second signal is provided to the second timing control signal terminals of the gate driving units in odd-numbered stages and the first timing control signal terminals of the gate driving units in even-numbered stages.

16. A display device comprising a display region and a frame region surrounding the display region, wherein:
a portion of the frame region on at least one side of the display region is provided with a gate driving circuit,
the gate driving circuit comprises a plurality of gate driving units arranged along a first direction and a signal conversion unit, wherein:
each of the gate driving units comprises a first transistor, a second transistor, a third transistor, a fourth transistor, a fifth transistor, a sixth transistor, a seventh transistor, an eighth transistor, a first capacitor and a second capacitor, wherein:
a gate of the first transistor is electrically connected to a first input terminal of the gate driving unit,
a first electrode of the first transistor is electrically connected to a first scanning control signal terminal of the gate driving unit,
a second electrode of the first transistor is electrically connected to a second electrode of the second transistor,
a gate of the second transistor is electrically connected to a second input terminal of the gate driving unit,
a first electrode of the second transistor is electrically connected to a second scanning control signal terminal of the gate driving unit,
a gate of the third transistor is electrically connected to a second electrode of the first capacitor,
a first electrode of the third transistor is electrically connected to a first potential,
a second electrode of the third transistor is electrically connected to the second electrodes of the first transistor and the second transistor,
a gate of the fourth transistor is electrically connected to a reset signal terminal of the gate driving unit and receives a reset signal,
a first electrode of the fourth transistor is electrically connected to the first potential,
a second electrode of the fourth transistor is electrically connected to the second electrodes of the first transistor and the second transistor,
a gate of the fifth transistor is electrically connected to the second electrodes of the first transistor and the second transistor,
a first electrode of the fifth transistor is electrically connected to the first potential,
a second electrode of the fifth transistor is electrically connected to the second electrode of the first capacitor,
a gate of the sixth transistor is electrically connected to the second electrode of the first capacitor,
a first electrode of the sixth transistor is electrically connected to the first potential,
the second electrode of the sixth transistor is electrically connected to an output terminal of the gate driving unit,
a gate of the seventh transistor is electrically connected to a second timing control signal terminal,
a first electrode of the seventh transistor is electrically connected to the first potential,
a second electrode of the seventh transistor is electrically connected to the output terminal of the gate driving unit,
a gate of the eighth transistor is electrically connected to the second electrodes of the first transistor and the second transistor,
a first electrode of the eighth transistor is electrically connected to a first timing control signal terminal of the gate driving unit,
a second electrode of the eighth transistor is electrically connected to the output terminal of the gate driving unit,
a first electrode of the first capacitor is electrically connected to the first electrode of the eighth transistor,
the second electrode of the first capacitor is electrically connected to the gate of the third transistor,
a first electrode of the second capacitor is electrically connected to the second electrodes of the first transistor and the second transistor, and
a second electrode of the second capacitor is electrically connected to the output terminal of the gate driving unit,
an output terminal of a preceding stage gate driving unit is electrically connected to a first input terminal of a following stage gate driving unit, and a second input terminal of the preceding stage gate driving unit is electrically connected to an output terminal of the following stage gate driving unit;
the first timing control signal terminals of gate driving units in odd-numbered stages are electrically connected to each other,
the second timing control signal terminals of gate driving units in even-numbered stages are electrically connected to each other,
the first timing control signal terminals of the gate driving units in odd-numbered stages and the second timing control signal terminals of the gate driving units even-numbered stages are electrically connected to a first lead terminal,
the second timing control signal terminals of the gate driving units in odd-numbered stages are electrically connected to each other, the first timing control signal terminals of the gate driving units in even-numbered stages are electrically connected to each other, and the second timing control signal terminals of the gate driving units in odd-numbered stages and the first timing control signal terminals of the gate driving units in even-numbered stages are electrically connected to a second lead terminal, and the signal conversion unit receives a first clock signal, a second clock signal, the first potential and the reset signal, and providing a first signal to the first lead terminal and a second signal to the second lead terminal.

17. The display device according to claim 16, wherein the display region comprises:
a plurality of scanning lines;
a plurality of data lines; and
an array pixel region surrounded by the scanning lines and the data lines,
wherein an output terminal of a gate driving unit of each stage is electrically connected to one scanning line.

18. The display device according to claim 16, wherein the signal conversion unit comprises ninth to fourteenth transistors, wherein:
a gate and a first electrode of the ninth transistor are electrically connected to the reset signal terminals,
a second electrode of the ninth transistor is electrically connected to the first lead terminal;
a gate and a first electrode of the tenth transistor are electrically connected to the reset signal terminals,
a second electrode of the tenth transistor is electrically connected to the second lead terminal,
a gate and a first electrode of the eleventh transistor are electrically connected to a first clock signal terminal,
a second electrode of the eleventh transistor is electrically connected to the first lead terminal,
a gate of the twelfth transistor is electrically connected to the first clock signal terminal,
a first electrode of the twelfth transistor is electrically connected to the first potential,
a second electrode of the twelfth transistor is electrically connected to the second lead terminal,
a gate of the thirteenth transistor is electrically connected to a second clock signal terminal,
a first electrode of the thirteenth transistor is electrically connected to the first potential,
a second electrode of the thirteenth transistor is electrically connected to the first lead terminal,
a gate and a first electrode of the fourteenth transistor are electrically connected to the second clock signal terminal, and
a second electrode of the fourteenth transistor is electrically connected to the second lead terminal.

19. The display device according to claim 18, wherein the display region comprises:
a plurality of scanning lines;
a plurality of data lines; and
an array pixel region surrounded by the scanning lines and the data lines,
wherein an output terminal of a gate driving unit at each stage is electrically connected to one scanning line.

20. The display device according to claim 16, wherein:
the first signal is provided to the first timing control signal terminals of the gate driving units in odd-numbered stages and the second timing control signal terminals of the gate driving units in even-numbered stages; and
the second signal is provided to the second timing control signal terminals of the gate driving units in odd-numbered stages and the first timing control signal terminals of the gate driving units in even-numbered stages.

* * * * *